United States Patent
Fang et al.

(10) Patent No.: US 11,881,424 B2
(45) Date of Patent: Jan. 23, 2024

(54) ELECTROSTATIC CHARGE MEASUREMENT TOOL

(71) Applicant: Intel Corporation, Santa Clara, CA (US)

(72) Inventors: Ho Fang, San Jose, CA (US); Robert Chroneos, Jr., Chandler, AZ (US); Subramani Iyer, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 17/691,165

(22) Filed: Mar. 10, 2022

(65) Prior Publication Data
US 2023/0290662 A1   Sep. 14, 2023

(51) Int. Cl.
*H01L 21/683*   (2006.01)
*G01R 31/28*   (2006.01)

(52) U.S. Cl.
CPC ...... *H01L 21/6833* (2013.01); *G01R 31/2887* (2013.01)

(58) Field of Classification Search
CPC .. G01R 31/2887; G01R 29/24; H01L 21/6833
See application file for complete search history.

(56) References Cited

U.S. PATENT DOCUMENTS

| | | | | |
|---|---|---|---|---|
| 4,134,137 A * | 1/1979 | Jacobs | ............... | H04N 1/1912 378/29 |
| 2006/0267622 A1 * | 11/2006 | Lagowski | ............ | G01R 31/312 324/754.21 |
| 2016/0154042 A1 * | 6/2016 | Kikunaga | ............. | G01R 29/24 324/457 |
| 2018/0356452 A1 * | 12/2018 | Agnello | ............ | G01R 31/2831 |

OTHER PUBLICATIONS

Noras, Maciej A., "Non-contact surface charge/voltage measurements—Fieldmeter and voltmeter methods", Advanced Energy, Jan. 2002, 6 pages, ENG-Voltmeter-and-Fieldmeter-Methods-261-01 4.20.
Advanced Energy Industries, Inc., "Non-Contact Surface Charge/Voltage Measurements: Capacitive Probe—Principle of Operation", ENG-ESVM-Capacitive-Probe-Whitepaper-265-01 11.20.

* cited by examiner

*Primary Examiner* — Scott Bauer
(74) *Attorney, Agent, or Firm* — Viering, Jentschura & Partner mbB

(57) ABSTRACT

The present disclosure is directed to an electrostatic charge measurement tool and dedicated system having a probe configured to scan the surface of a target, and methods for taking the electrostatic charge measurements. In an aspect, the probe is a non-contact electrostatic probe that may be moveable across the surface of the target and be adjustable in its height from the surface of the target. In another aspect, the target is an electrostatic chuck or semiconductor wafer. In a further aspect, the electrostatic charge measurement system may perform insitu measurement of targets without removing them from their working environment.

20 Claims, 7 Drawing Sheets

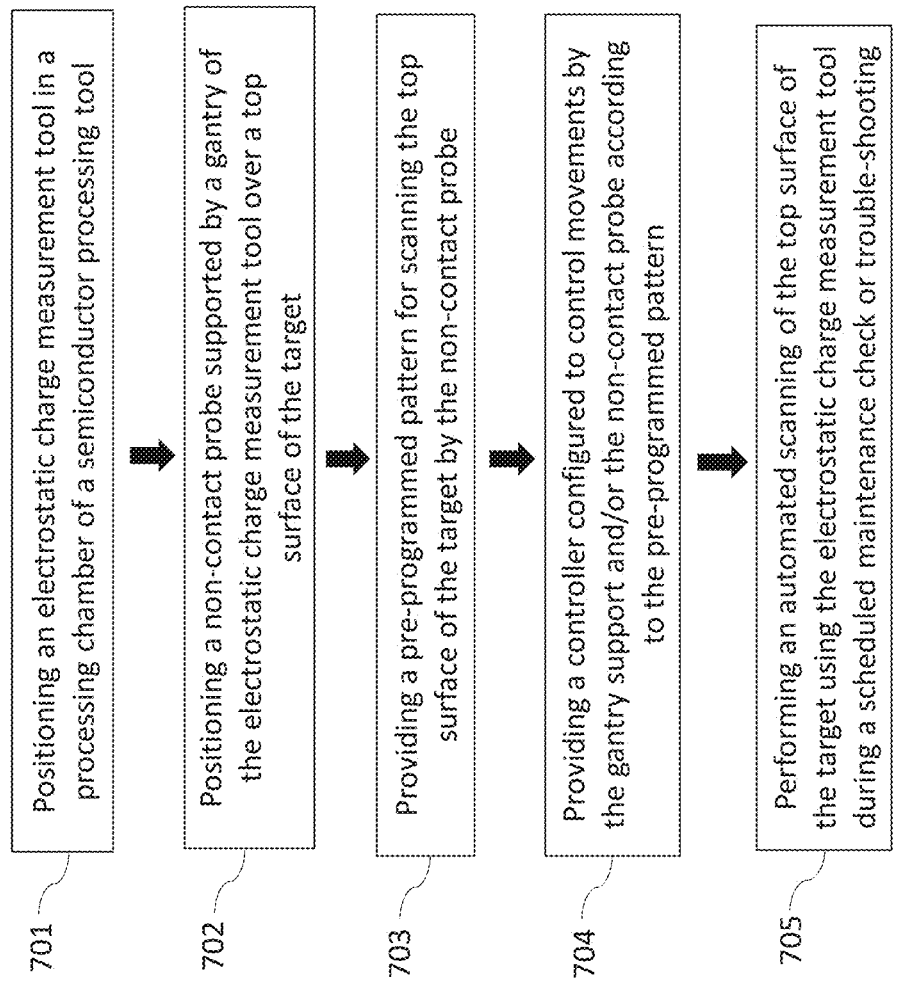

ELECTROSTATIC CHARGE MEASUREMENT TOOL

BACKGROUND

In the semiconductor manufacturing industry, electrostatic chucks (ESC) have an important role in manufacturing semiconductors as components in semiconductor processing tools used to reliably grip silicon wafers in both atmospheric and vacuum environments. In these semiconductor processing tools, the ESC may be viewed as a specialized type of stage or working surface used to hold down or pick up semiconductor wafers by an electrical force, i.e., the attraction forces from static electricity.

When a semiconductor wafer is placed on a conventional ESC, for example, a monopolar or bipolar voltage may be applied to the ESC's internal electrodes and a directional electric field is created. The positive and negative charges drift within the semiconductor wafer attracted by the induced charges due to the polarity of the chuck's internal electrodes. This polarity charge movement creates the attractive or grip force between the ESC and the semiconductor wafer that holds the wafer in place for the process step to be performed in the semiconductor processing tool.

As the ESC of a semiconductor processing tool undergoes repeated charging of its working surface, there may be a problem of charge accumulation, i.e., a substrate potential, that may occur that affects the stability of the placement of the semiconductor wafer on the ESC by creating other charges that may assist or hinder the grip force. The measurement of the surface charge on the ESC using a specifically designed system with an electrostatic probe may be an approach for detecting such charge accumulation.

In addition, with the continuing reduction of line widths in semiconductor devices, there are an increasing number of issues with electrostatic discharge (ESD) related phenomena and the need for improved electrostatic charge control during semiconductor wafer processing. As a result, there may be a need for metrology to encompass charge measurements, such as surface voltage and charge detection and analysis, as part of routine semiconductor wafer processing operations. The ability to perform electrostatic charge detection and analysis without significant delays in processing operations would additionally incentivize and promote inspections of ESCs, wafers, and other components that may be susceptible to electrostatic discharge.

BRIEF DESCRIPTION OF THE DRAWINGS

In the drawings, like reference characters generally refer to the same parts throughout the different views. The drawings are not necessarily to scale, with emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which:

FIG. 7 shows a simplified flow diagram for another exemplary method according to an aspect of the present disclosure.

DETAILED DESCRIPTION

Figure 1:
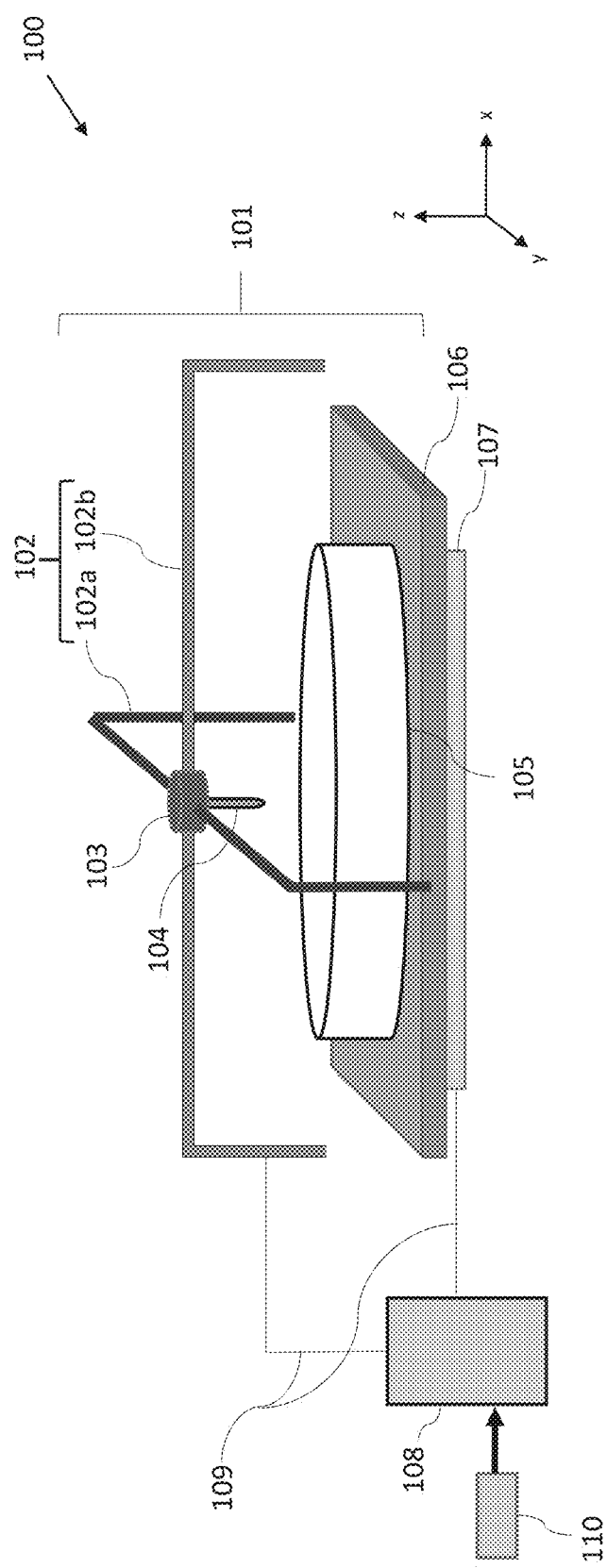
FIG. 1 shows a schematic view of an exemplary electrostatic measurement system according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure is directed to an electrostatic measurement system that includes an electrostatic charge measurement tool having a probe that may be held by a support structure over a top surface of a target. The target may be placed on a support platform for obtaining electrical measurements from the target. The electrostatic measurement system further includes a controller and/or processor that may be integrated with or coupled to a database for storing a pre-programmed pattern for automated scanning of the target, and a user interface to provide inputs that enable the pre-programmed patterns for automated scan, modify the automated scans, and provide for manual scanning of the target.

The present disclosure is also directed an electrostatic charge measurement tool that includes a non-contact probe and a support structure configured to hold the probe over a top surface of a target, which enables the probe to be positioned to obtain electrical measurements from the entire top surface of the target. In an aspect, the support structure having a probe maneuvering mechanism may be used to move the probe in an x-y plane over the top surface of the target. The probe maneuvering mechanism may have a subcomponent for moving the probe in the z-direction to different heights over the surface of the target.

The present disclosure is additionally directed to an electrostatic measurement system with an electrostatic charge measurement tool having a non-contact probe that may be held by a support structure over a top surface of a target that need not be removed from its working environment. The target may be maintained in its normally situated position with its connections undisturbed for insitu measurement of any electrostatic charge.

The present disclosure is further directed a method that positions a target for scanning by an electrostatic charge measurement tool having a non-contact probe that may be moved in a pre-programmed pattern for automated scanning of a top surface of the target to be measured by the probe.

To more readily understand and put the present disclosure into practical effect, the present electrostatic measurement system, particular aspects will now be described by way of examples provided in the drawings that are not intended as limitations. The advantages and features of the aspects herein disclosed will be apparent through reference to the following descriptions relating to the accompanying drawings. Furthermore, it is to be understood that the features of the various aspects described herein are not mutually exclusive and can exist in various combinations and permutations. For the sake of brevity, duplicate descriptions of features and properties may be omitted.

In FIG. 1, an exemplary electrostatic measurement system 100 according to an aspect of the present disclosure is shown. In this aspect, the electrostatic measurement system 100 includes an electrostatic charge measurement tool 101, a support platform 106 with a platform maneuvering control mechanism 107, and a controller/processor 108. In addition, FIG. 1 shows the electrostatic charge measurement tool 101 having a support structure or gantry 102 configured to hold a non-contact probe 104 over a top surface of a target 105. In an aspect, the support structure 102 may have support components 102a and 102b, which may individually, or together, may hold and enable the rapid movement of the probe 104 in an x-y plane over the top surface of the target 105.

In another aspect, the electrostatic charge measurement tool 101 may have a probe maneuvering mechanism 103 configured for moving the probe 104 along, either or both, of the support components 102a and 102b to enable movement in the x-y plane over the top surface of the target 105 when a scan is performed using the electrostatic measurement system 100. In another aspect, the probe maneuvering mechanism 103 may be configured to have a subcomponent (not shown) to move the probe 104 in the z-direction to adjust the distance between the probe 104 and the top surface of the target 105. In yet another aspect, a height/distance for a non-contact probe to be positioned from a top surface of a target may be in a range of 1 mm to 5 mm.

In an aspect, it is preferable to minimize a non-contact probe height to be close to the tested surface as possible. Moreover, since an electric field relies on the measurement distance, there is also a need to fix a probe sensor at a set distance from a target to be able to perform a high precision measurement.

It is within the scope of the present disclosure to enable the movement of the support components 102a and 102b, probe maneuvering mechanism 103, and platform maneuvering mechanism 107 using conventional mechanical drive mechanisms (e.g., gear, pulley, and lift systems, servo motors, and other electronic circuitry). The mechanical drive mechanism of the present disclosure is able to provide the required precision and repeatability to move the non-contact probe and/or target to collect data at each location of a target.

In an aspect, the present non-contact probe may have a small detection surface to provide a good resolution of the individual areas of electrostatic charges on the parts of a target to be measured. The probe may have a sensor that uses a vibrating capacitor method, which is a very well-known and effective method for measuring surface electric potentials. The non-contact prevents the charges from "leaking" away during measurement. In addition, non-contact systems can also measure more points at one time and without putting pressure on the object, i.e. one section of the probe is end detecting and another is side detecting relative to the probe longitudinal direction. In addition, since a non-contact probe is preferred, there is no need for frequent cleaning and/or replacement. It is also within the scope of the present disclosure to use multiple non-contact probes at different fixed locations on a support structure to improve the efficiency of an electrostatic charge measurement tool.

In another aspect, it is within the scope of the present disclosure to also use contact probes that may touch a top surface of a target at designated locations to perform electrostatic potential measurements. In yet another aspect, it is within the scope of the present disclosure to also use optical probes, such as optical E-field sensors, interferometers, optical fiber sensors, cameras, etc.

In a further aspect, the platform maneuvering mechanism 107 may be configured for moving the target placed thereon in an x-y plane under the probe. In addition, the platform maneuvering mechanism 107 may be further configured to include a subcomponent (not shown) for moving the support platform 106 in the z-direction to adjust the distance between the probe 104 and the top surface of the target 105.

According to the present disclosure, the electrostatic measurement system 100 may include the controller/processor 108 that may be coupled via connections 109 to the support structure 102 and/or the platform maneuvering mechanism 107 to provide instructions for their movements during a scanning process. It is within the scope of the present disclosure to provide the controller/processor 108 as a standalone computing device, or an integrated component of the support structure 102 and/or the platform maneuvering mechanism 107.

In an aspect, a pre-programmed pattern for the scanning of a top surface of the target by the probe 104 may be stored in a database, which may be integrated with a controller or situated remotely, coupled to the controller/processor 108. The use of pre-programmed patterns may permit the scans to be performed in an automated process and provide for generating selective scans of greater or lesser details as needed. In an aspect, the pre-programmed pattern may control movements in the x-direction, y-direction, and z-direction, which may be set according to the type and size of a specific target. In yet another aspect, the electrostatic measurement system 100 may include a user interface 110 to provide inputs for the pre-programmed pattern for automated scans, for modifying the automated scans, or for manually scanning of a target.

In yet another aspect, it is intended that the target 105 may be an electrostatic chuck (ESC), a semiconductor wafer (not shown), or other objects needing to be inspected for the possible buildup of electrostatic charge; such objects may include those that already have protection strategies for electrostatic discharge in place but may need periodic testing to confirm the effectiveness of such strategies. For ESCs, the height of the probe and/or the support platform may be adjusted to accommodate the differences in thicknesses for various models of ESCs, when conducting scans using the present electrostatic measurement system.

Figure 2:
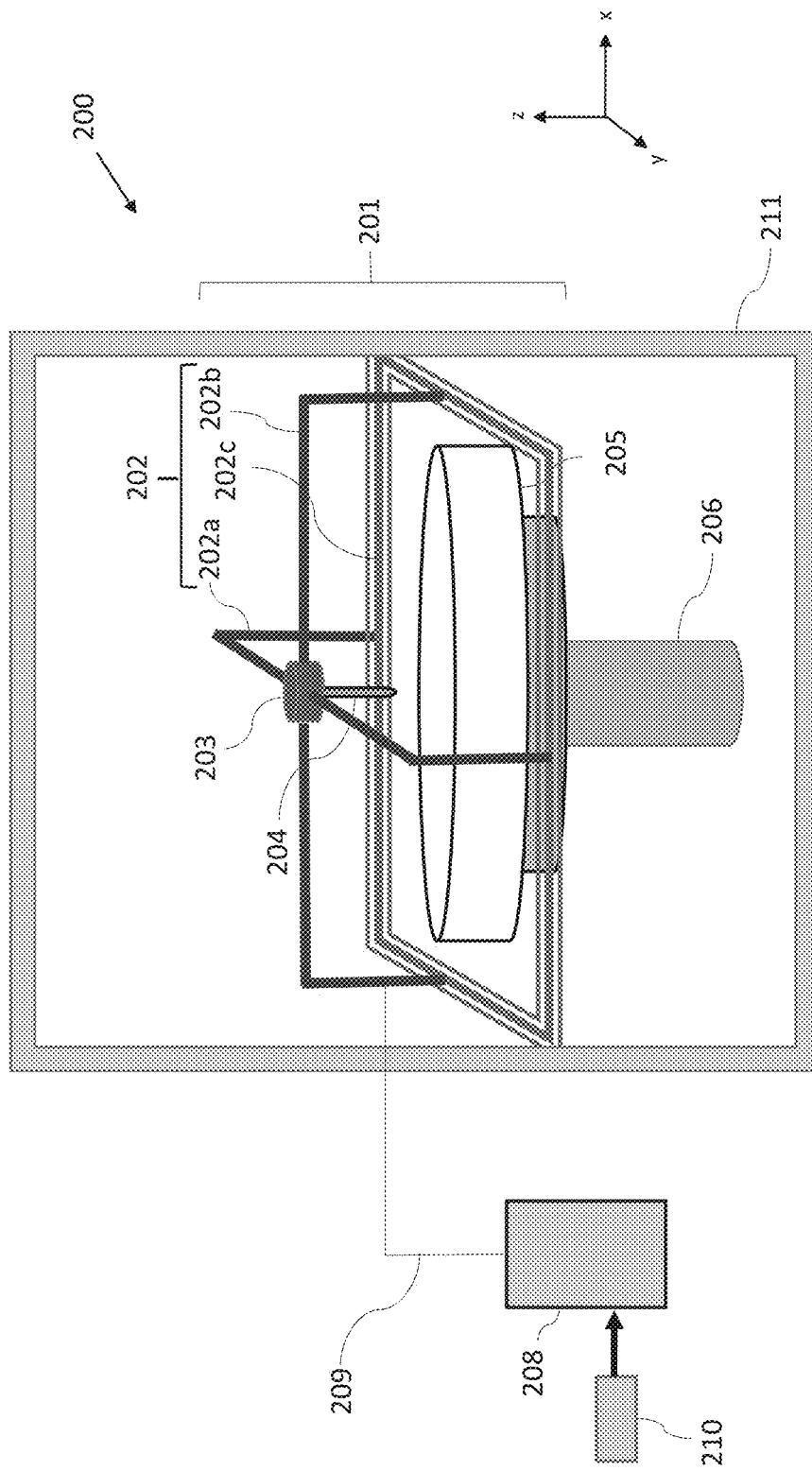
FIG. 2 shows a schematic view of another exemplary electrostatic measurement system according to another aspect of the present disclosure.

In FIG. 2, another exemplary electrostatic measurement system 200 is shown for measuring the electrostatic charge of a target 205 without removing it from its working environment, according to an aspect of the present disclosure. The electrostatic measurement system 200 may have many of the same features as described above for the electrostatic measurement system 100.

In this aspect, the electrostatic measurement system 200 includes an electrostatic charge measurement tool 201 having a support structure or gantry 202 configured to hold a non-contact probe 204, which is placed over a top surface of a target 205 on its support 206 in a chamber or compartment 211 of a semiconductor processing tool (not shown), and a controller/processor 208 having a user interface 210 to provide inputs for pre-programmed patterns for automated scans, for modifying the automated scans, or for manually scanning of a target. The electrostatic charge measurement tool 201 may be appropriately sized to fit within the chamber 211 for placement over a target to perform insitu measurements for the electrostatic charge.

In addition, as shown in FIG. 2, the support structure 202 may have support frame components 202a and 202b, which may individually, or together, may hold and enable the rapid movement of the probe 204 in an x-y plane over the top surface of the target 205. In yet another aspect, the support structure 202 may have a support base component 202c, which forms a completely or partially perimeter around the target and provides a foundation for support frame components 202a and 202b. It is within the scope of the present disclosure to have the shape of the support base component 202c be circular or other shapes, as well as possibly being separate individual "feet" or base plates connected to the support frame components 202a and 202b.

In a further aspect, it may be advantageous to have the support structure 202 configured to be collapsed or disassembled for ease of placement in the chamber and subsequently set up or assembled in chamber 211 for performing the insitu measurements to generate an electrostatic charge map. Such data may be collected within an hour, including installing and removal of the electrostatic measurement system.

In this aspect, the electrostatic charge measurement tool 201 may include a probe maneuvering mechanism 203 configured to enable the movement of the probe 204 along, either or both, of the support frame component 202a and 202b in the x-y plane over the top surface of the target 205 when a scan is performed using the electrostatic measurement system 200. In a further aspect, the probe maneuvering mechanism 203 may be configured to have a subcomponent (not shown) to move the probe 204 in the z-direction to adjust the distance between the probe 204 and the top surface of the target 205. In yet another aspect, a height/distance for a non-contact probe to be positioned from a top surface of a target may be in a range of 1 mm to 5 mm.

In yet another aspect, it is intended that the target 205 may be an electrostatic chuck (ESC), a semiconductor wafer (not shown), or other objects needing to be inspected insitu for the possible buildup of electrostatic charge. In an aspect, a semiconductor wafer may have insitu measurements performed while it is positioned on an ESC, a wafer holder in a semiconductor tool, or other wafer handling accessory during a semiconductor processing operation.

Figure 3:
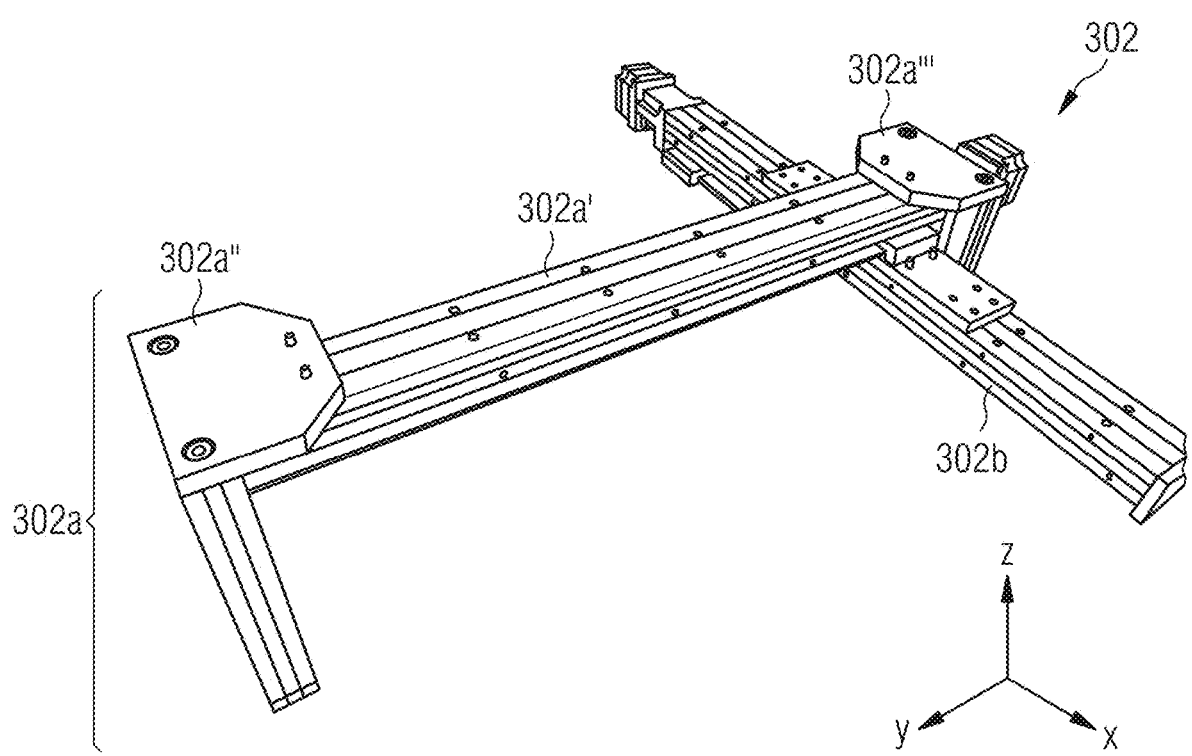
FIG. 3 shows a support structure of an electrostatic charge measurement tool according to another aspect of the present disclosure.

FIG. 3 shows a support structure 302 for an electrostatic charge measurement tool according to another aspect of the present disclosure. In this aspect, the support structure 302 may have support components 302a and 302b, which may hold and enable the movement of a probe (not shown) in an x-y plane over a top surface of a target (not shown). As shown in FIG. 3, the support component 302a may have a horizontal rail section 302a' with vertical pillar sections 302a" and 302a''' affixed at its ends, i.e., the horizontal rail section 302a' being supported between them. In this aspect, the support component 302a may be a "fixed" structure. Also in this aspect, the support component 302b may move along the horizontal rail section 302a' in the y-direction, as a "moveable" structure. In addition, the support component 302b may be configured to allow a probe maneuvering mechanism (not shown) to move in the x-direction along its length or to adjust the distance between the probe and a top surface of a target.

Figure 4:
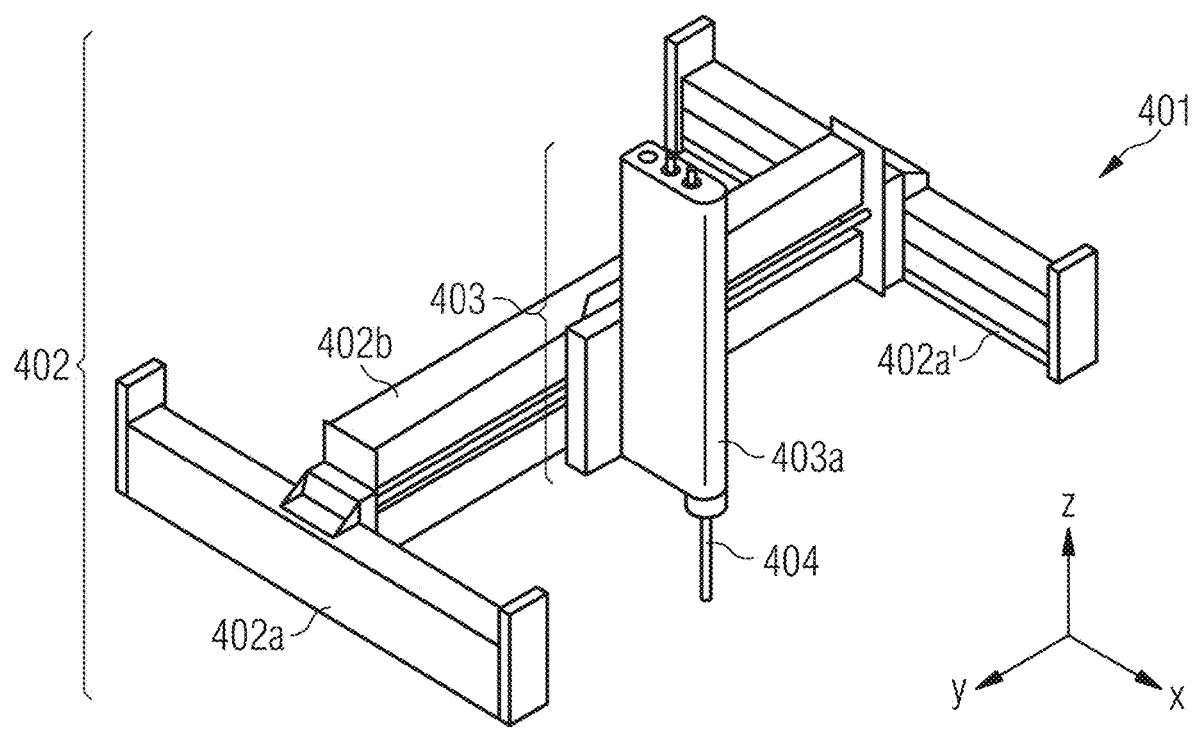
FIG. 4 shows a support structure and probe of an electrostatic charge measurement tool according to yet another aspect of the present disclosure.

In FIG. 4, according to yet another aspect of the present disclosure, a support structure 402 with a probe maneuvering mechanism 403 and non-contact probe 404 for a present electrostatic charge measurement tool 401 is shown. In this aspect, as shown in FIG. 4, a support component 402b may have a horizontal rail section affixed at its ends to support components 402a and 402a', i.e., the support component 402b being supported between them. The vertical support structures for support components 402a and 402a' are not shown. In this aspect, the support components 402a and 402a' may be "fixed" structures. Also in this aspect, the support component 402b may move along horizontal rail sections of support components 402a and 402a' in the x-direction, as a "moveable" structure.

In addition, the support component 402b may be configured to allow a probe maneuvering mechanism 403 to move in the y-direction along its length. The probe maneuvering mechanism 403 may include a subcomponent 403a for housing electronic components relating to the non-contact probe 404 as well as a mechanical drive mechanism for movement in the z-direction to adjust the distance between the probe 404 and a top surface of a target (not shown).

Figure 5:
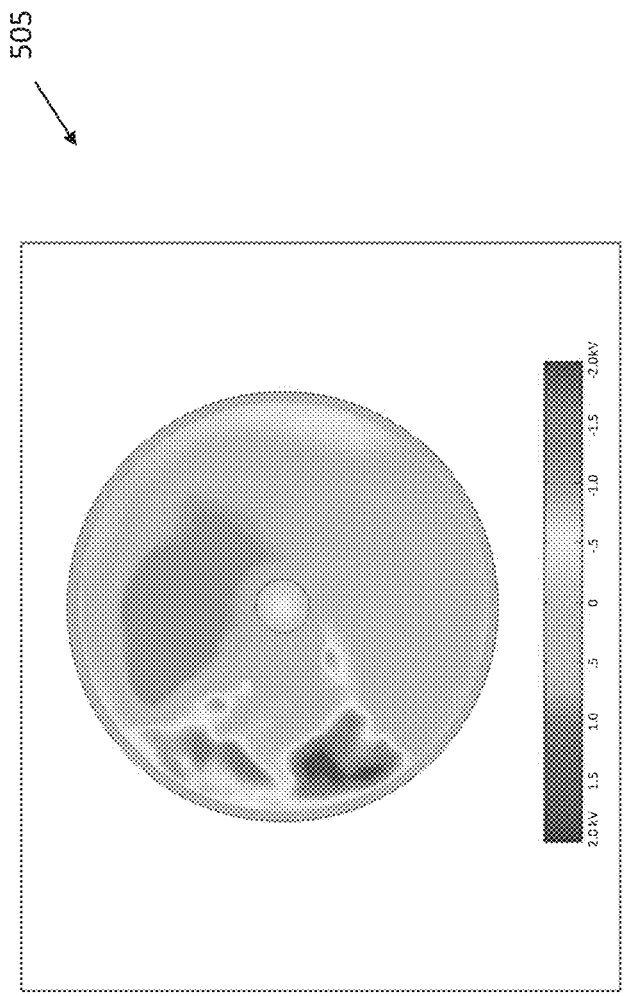
FIG. 5 shows a representative electrostatic potential measurement of a target electrostatic chuck provided by an electrostatic charge measurement tool according to further aspects of the present disclosure.

FIG. 5 shows a representative view of an electrostatic potential measurement or surface charge of a target electrostatic chuck provided by a present electrostatic charge measurement tool according to further aspects of the present disclosure. The present electrostatic charge measurement tools may be able to produce complete plot measurements or maps in as fast as 10 minutes and at a minimal cost beyond the initial investment cost of the tool. While not shown, the present electrostatic measurement tools may take measurements to show the changing surface potential of a target over time as well.

Figure 6:
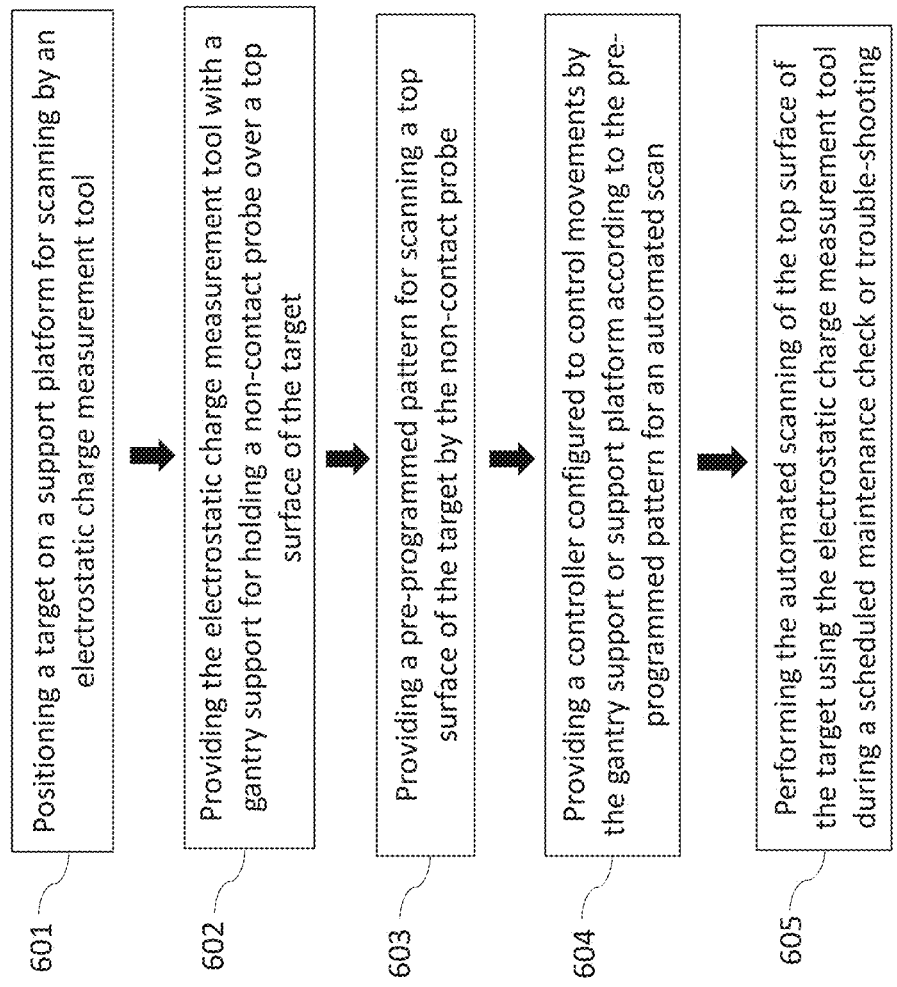
FIG. 6 shows a simplified flow diagram for an exemplary method according to an aspect of the present disclosure.

FIG. 6 shows a simplified flow diagram for an exemplary method according to an aspect of the present electrostatic measurement system.

The operation 601 may be directed to positioning a target on a support platform for scanning by an electrostatic charge measurement tool. The target may be an ESC or a semiconductor wafer.

The operation 602 may be directed to providing the electrostatic charge measurement tool with a gantry support for holding a non-contact probe over a top surface of the target.

The operation 603 may be directed to providing a pre-programmed pattern for scanning a top surface of the target by the non-contact probe.

The operation 604 may be directed to providing a controller/processor configured to control movements by the gantry support or support platform according to the pre-programmed pattern for an automated scan. The pre-programmed pattern may control movements in the x-direction, y-direction, and z-direction.

The operation 605 may be directed to performing the automated scanning of the top surface of the target using the electrostatic charge measurement tool during a scheduled maintenance check or trouble-shooting.

FIG. 7 shows a simplified flow diagram for another exemplary method according to an aspect of the present electrostatic measurement system. In an aspect, it may be preferred to measure an electrostatic charge distribution on an electrostatic chuck (ESC) while it is in its original chamber (lid open) to determine if, for example, a wafer position alarm may be caused by excessive non-uniform wafer chucking force due to residual/retained electrostatic charge. In accordance with the present disclosure, for example, an electrostatic charge map of a newly failed ESC may be generated while it is still in a processing chamber of a semiconductor tool. It may be possible to generate/collect such data within an hour, including installing and removal of the present electrostatic measurement tool.

The operation 701 may be directed to positioning an electrostatic charge measurement tool in a processing chamber of a semiconductor processing tool. The target may be an ESC or a semiconductor wafer.

The operation 702 may be directed to providing the electrostatic charge measurement tool with a gantry support for holding a non-contact probe over a top surface of the target.

The operation 703 may be directed to providing a pre-programmed pattern for scanning a top surface of the target by the non-contact probe.

The operation 704 may be directed to providing a controller/processor configured to control movements by the gantry support and/or the non-contact probe according to the pre-programmed pattern for an automated scan. The pre-programmed pattern may control movements in the x-direction, y-direction, and z-direction.

The operation 705 may be directed to performing the automated scanning of the top surface of the target using the electrostatic charge measurement tool during a scheduled maintenance check or trouble-shooting.

It will be understood that any property described herein for a specific tool may also hold for any tool or system described herein. It will also be understood that any property described herein for a specific method may hold for any of the methods described herein. Furthermore, it will be understood that for any tool, system, or method described herein, not necessarily all the components or operations described will be enclosed in the tool, system, or method, but only some (but not all) components or operations may be enclosed.

To more readily understand and put the present disclosure into practical effect, the present electrostatic charge measurement tool and system, and methods for their use will now be described by way of examples. For the sake of brevity, duplicate descriptions of features and properties may be omitted.

EXAMPLES

Example 1 provides an electrostatic charge measurement tool including a probe, and a support structure configured to hold the probe over a top surface of a target, for which the probe is positioned to obtain electrical measurements by scanning the top surface of the target.

Example 2 may include the electrostatic charge measurement tool of example 1 and/or any other example disclosed herein, for which the support structure further includes a probe maneuvering mechanism for moving the probe in an x-y plane over the top surface of the target.

Example 3 may include the electrostatic charge measurement tool of example 2 and/or any other example disclosed herein, for which the probe maneuvering mechanism further includes a subcomponent for moving the probe in the z-direction to different heights over the surface of the target.

Example 4 may include the electrostatic charge measurement tool of example 1 and/or any other example disclosed herein, for which the support structure further includes a gantry support including a fixed structure and moveable structure, for which the moveable structure maneuvers along a length of the fixed structure, and a probe maneuvering mechanism for moving the probe along a length of the moveable structure.

Example 5 may include the electrostatic charge measurement tool of example 1 and/or any other example disclosed herein, further includes a support platform for holding the target and a platform maneuvering mechanism for moving the support platform with the target in x-y-z planes under the probe.

Example 6 may include the electrostatic charge measurement tool of example 5 and/or any other example disclosed herein, for which the support structure further includes a support base that forms a perimeter around the target and provides a foundation for support components that hold the probe above the target for insitu measurements.

Example 7 may include the electrostatic charge measurement tool of example 1 and/or any other example disclosed herein, for which the probe further includes a non-contact electrostatic probe.

Example 8 may include the electrostatic charge measurement tool of example 1 and/or any other example disclosed herein, for which the target further includes an electrostatic chuck or a semiconductor wafer.

Example 9 provides a method including positioning a target for scanning by an electrostatic charge measurement tool, for which the electrostatic charge measurement tool is provided with a non-contact probe, providing a pre-programmed pattern for scanning a top surface of the target by the non-contact probe, and performing an automated scanning of the top surface of the target using the electrostatic charge measurement tool to generate an electrostatic charge map.

Example 10 may include the method of example 9 and/or any other example disclosed herein, further includes providing user instructions to modify the automated scanning of the top surface of the target or to manually perform a scan in lieu of the automated scanning.

Example 11 may include the method of example 9 and/or any other example disclosed herein, further includes providing instructions to a processor configured to control movements by a gantry support according to the pre-programmed pattern for the automated scan, for which the gantry support holds the non-contact probe over the top surface of the target.

Example 12 may include the method of example 11 and/or any other example disclosed herein, for which the gantry support further includes a fixed structure and moveable structure, and for which the automated scanning further includes moving the moveable structure along a length of the fixed structure, and moving the probe along a length of the moveable structure according to the pre-programmed pattern.

Example 13 may include the method of example 11 and/or any other example disclosed herein, for which the gantry support further includes a subcomponent for moving the probe in the z-direction and for which the automated scanning further includes moving the probe to different set heights over the surface of the target according to the pre-programmed pattern.

Example 14 may include the method of example 9 and/or any other example disclosed herein, further includes providing instructions to a processor configured to control movements by a support platform according to the pre-programmed pattern for the automated scanning, for which the support platform holds the target under the probe.

Example 15 may include the method of example 14 and/or any other example disclosed herein, for which the support platform further includes a platform maneuvering mechanism for moving the support platform with the target in x-y-z planes under the probe according to the pre-programmed pattern for the automated scanning.

Example 16 may include the method of example 9 and/or any other example disclosed herein, for which the target is provided in its original orientation and the electrostatic charge measurement tool is configured and sized for placement over the target for insitu measurements.

Example 17 may include the method of example 9 and/or any other example disclosed herein, for which the target further includes an electrostatic chuck or a semiconductor wafer.

Example 18 provides an electrostatic measurement system including an electrostatic charge measurement tool including a non-contact probe, a support structure configured to hold the non-contact probe over a top surface of a target, for which the probe is configured to be positioned to obtain electrical measurements from the top surface of the target, and a controller provided with a pre-programmed pattern for automated scanning of the target, and a user interface to provide inputs for the pre-programmed pattern for automated scanning, for modifying the automated scans, or for manually scanning of the target.

Example 19 may include the electrostatic measurement system of example 18 and/or any other example disclosed herein, further includes a support platform for holding the target and a platform maneuvering mechanism for moving the support platform holding the target in x-y-z planes under the probe according to the pre-programmed pattern.

Example 20 may include the electrostatic measurement system of example 18 and/or any other example disclosed herein, for which the support structure further includes a support base that forms a perimeter around the target and provides a foundation for support components that hold the probe above the target, for which the target is provided in its original orientation and the electrostatic charge measurement tool is configured and sized for placement over the target to perform insitu measurements.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

The terms "and" and "or" herein may be understood to mean "and/or" as including either or both of two stated possibilities.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. An electrostatic charge measurement tool comprising:
   a probe; and
   a collapsible support structure configured to hold the probe over a top surface of a target, wherein the probe is positioned to obtain electrical measurements by scanning the top surface of the target.

2. The electrostatic charge measurement tool of claim 1, wherein the collapsible support structure further comprises a probe maneuvering mechanism for moving the probe in an x-y plane over the top surface of the target.

3. The electrostatic charge measurement tool of claim 2, wherein the probe maneuvering mechanism further comprises a subcomponent for moving the probe in the z-direction to different heights over the surface of the target.

4. The electrostatic charge measurement tool of claim 1, wherein the collapsible support structure further comprises a gantry support comprising a fixed structure and moveable structure, wherein the moveable structure maneuvers along a length of the fixed structure; and
   a probe maneuvering mechanism for moving the probe along a length of the moveable structure.

5. The electrostatic charge measurement tool of claim 1, further comprises a support platform for holding the target and a platform maneuvering mechanism for moving the support platform with the target in x-y-z planes under the probe.

6. The electrostatic charge measurement tool of claim 3, wherein the collapsible support structure further comprises a support base that forms a perimeter around the target and provides a foundation for support components that hold the probe above the target.

7. The electrostatic charge measurement tool of claim 1, wherein the probe further comprises a non-contact electrostatic probe.

8. The electrostatic charge measurement tool of claim 1, wherein the target further comprises an electrostatic chuck or a semiconductor wafer.

9. A method comprising:
   providing an insitu target for scanning by an electrostatic charge measurement tool, wherein the electrostatic charge measurement tool is provided with a collapsible support structure and a non-contact probe;
   providing a pre-programmed pattern for scanning a top surface of the insitu target by the non-contact probe; and
   performing an automated scanning of the top surface of the insitu target using the electrostatic charge measurement tool to generate an electrostatic charge map.

10. The method of claim 9, further comprises providing user instructions to modify the automated scanning of the top surface of the insitu target or to manually perform a scan in lieu of the automated scanning.

11. The method of claim 9, further comprises providing instructions to a processor configured to control movements by a gantry support according to the pre-programmed pattern for the automated scan, wherein the gantry support holds the non-contact probe over the top surface of the insitu target.

12. The method of claim 11, wherein the gantry support further comprises a fixed structure and moveable structure, and wherein the automated scanning further comprises moving the moveable structure along a length of the fixed structure; and
   moving the probe along a length of the moveable structure according to the pre-programmed pattern.

13. The method of claim 11, wherein the gantry support further comprises a subcomponent for moving the probe in the z-direction and wherein the automated scanning further comprises moving the probe to different set heights over the surface of the target according to the pre-programmed pattern.

14. The method of claim 9, further comprises providing instructions to a processor configured to control movements by a support platform according to the pre-programmed pattern for the automated scanning, wherein the support platform holds the target under the probe.

15. The method of claim 14, wherein the support platform further comprises a platform maneuvering mechanism for moving the support platform with the target in x-y-z planes under the probe according to the pre-programmed pattern for the automated scanning.

16. The method of claim 9, wherein the insitu target is provided in its original orientation and the electrostatic charge measurement tool is configured and sized for placement over the target for insitu measurements.

17. The method of claim 9, wherein the insitu target further comprises an electrostatic chuck or semiconductor wafer.

18. An electrostatic measurement system comprising:
an electrostatic charge measurement tool comprising:
a non-contact probe;
a collapsible support structure configured to hold the non-contact probe over a top surface of a target, wherein the probe is configured to be positioned to obtain electrical measurements from the top surface of the target; and
a controller provided with a pre-programmed pattern for automated scanning of the target; and
a user interface to provide inputs for the pre-programmed pattern for automated scan, for modifying the automated scannings, or for manually scanning of the target.

19. The electrostatic measurement system of claim 18, further comprises a support platform for holding the target and a platform maneuvering mechanism for moving the support platform holding the target in x-y-z planes under the probe according to the pre-programmed pattern.

20. The electrostatic measurement system of claim 18, wherein the collapsible support structure further comprises a support base that forms a perimeter around the target and provides a foundation for support components that hold the probe above the target, wherein the target is provided in its original orientation and the electrostatic charge measurement tool is configured and sized for placement over the target to perform insitu measurements.

* * * * *